United States Patent
Tsai et al.

(10) Patent No.: US 7,737,453 B2
(45) Date of Patent: Jun. 15, 2010

(54) LIGHT EMITTING DIODE STRUCTURE

(75) Inventors: Tzong-Liang Tsai, Taichung (TW);
Chi-Shen Lee, Taichung (TW);
Ting-Kai Huang, Taichung (TW)

(73) Assignee: Huga Optotech Inc., Taichung (TW)

( * ) Notice: Subject to any disclaimer, the term of this patent is extended or adjusted under 35 U.S.C. 154(b) by 420 days.

(21) Appl. No.: 11/744,226

(22) Filed: May 4, 2007

(65) Prior Publication Data
US 2007/0206651 A1 Sep. 6, 2007

Related U.S. Application Data

(63) Continuation-in-part of application No. 10/857,682, filed on May 29, 2004, now abandoned.

(51) Int. Cl.
*H01L 29/205* (2006.01)
(52) U.S. Cl. .............. 257/91; 257/79; 257/90; 257/E33.016
(58) Field of Classification Search .......... 257/79, 257/90, 102, 97, 103, 91
See application file for complete search history.

(56) References Cited

U.S. PATENT DOCUMENTS

| 6,712,478 | B2 * | 3/2004 | Sheu et al. ............... 257/79 |
| 2003/0122147 | A1 * | 7/2003 | Sheu .......................... 257/103 |
| 2004/0099869 | A1 * | 5/2004 | Gaska et al. ............... 257/79 |
| 2004/0159851 | A1 * | 8/2004 | Edmond et al. ............ 257/99 |

* cited by examiner

*Primary Examiner*—Jerome Jackson, Jr.
*Assistant Examiner*—Dale Page (57) ABSTRACT

Disclosed is a light emitting diode structure including a Constructive Oxide Contact Structure contact layer. The light emitting diode structure comprises a substrate, a buffer layer formed on the substrate, a lower confinement layer formed on the buffer layer, a light emitting layer formed on the lower confinement layer, an upper confinement layer formed on the light emitting layer, a Constructive Oxide Contact Structure contact layer formed on the upper confinement layer whose conducting type can be P-type, N-type, or I-type, a first electrode, and a second electrode (transparent electrode). The transparent electrode is formed on the Constructive Oxide Contact Structure contact layer as an anode of the light emitting diode. The first electrode is formed on the lower confinement layer and is spaced apart from the light emitting layer, the upper confinement layer, the contact layer, and the transparent electrode. The first electrode is used as a cathode of the light emitting diode.

9 Claims, 9 Drawing Sheets

FIG. 9 ations tend to bend at the interfaces. Conventionally, the superlattice structure of AlGaN/GaN was used to reduce the cracks and dislocations in a thick GaN layer which can be formed as an upper confinement layer disposed on the light emitting layer. Despite these prior efforts do increase a light emitting efficiency to some extent, a satisfactory level is not yet to achieve.
LIGHT EMITTING DIODE STRUCTURE

CROSS REFERENCE

This is a continuation-in-part application for the application Ser. No. 10/857,682 filed on May 29, 2004 now abandoned.

FIELD OF THE INVENTION

The present invention relates to a light emitting diode structure, and more particularly, to a light emitting diode structure comprising III-V group elements and including a Constructive Oxide Contact Structure contact layer

BACKGROUND OF THE INVENTION

Gallium nitride (GaN) based blue light emitting diode has been industrialized on large scales worldwide since a group of Japanese researchers made a breakthrough in Gallium nitride (GaN) based extension technology in 1993.

Figure 1:
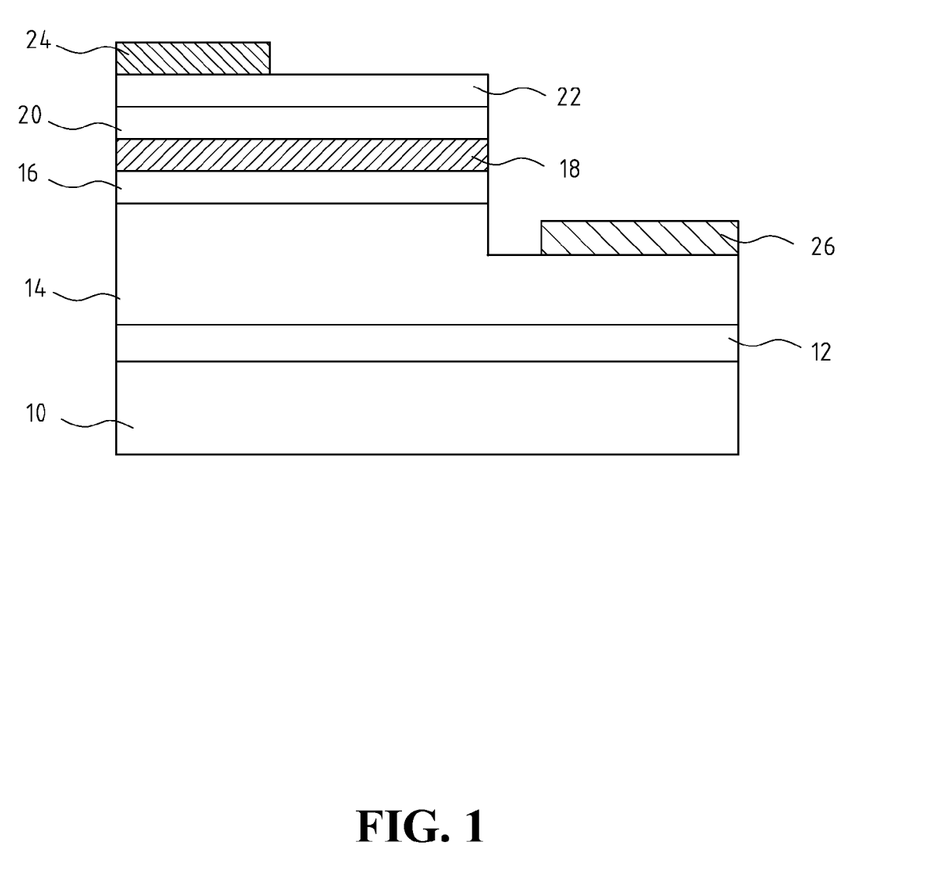
FIG. 1 is a schematic, cross-sectional diagram showing a light emitting diode made of III-V group elements according to a prior art.

A conventional Gallium nitride (GaN) based light emitting diode structure, shown in FIG. 1, is constructed on a substrate 10 made of a material such as $Al_2O_3$. The light emitting diode 1 includes, sequentially from bottom to top, a nucleation layer 12, a N-type doped conducting buffer layer 14 made of N-type doped Gallium nitride (GaN) which makes a subsequent crystalline growth more smoothly and easily, a lower confinement layer 16, an active layer 18 for light emission, an upper confinement layer 20, a contact layer 22 made of P-type Gallium nitride (GaN), and a transparent electrode 24 as an anode of the light emitting diode 1. The lower confinement layer 16 and the upper confinement layer 20 have opposite doping types. For example, when the lower confinement layer 16 is made of N-type doped Gallium nitride, the upper confinement layer 20 is made of P-type doped Gallium nitride (GaN). The transparent electrode 24 is usually made of a N-type doped material such as Indium Tin oxide, Cadmium Tin oxide, or an extremely thin metallic material. In addition, an electrode 26 as a cathode of the light emitting diode 1 is formed on the buffer layer 14 and in a region spaced apart from the lower and upper confinement layers 20 and 16, and the active layer 18.

Figure 2:
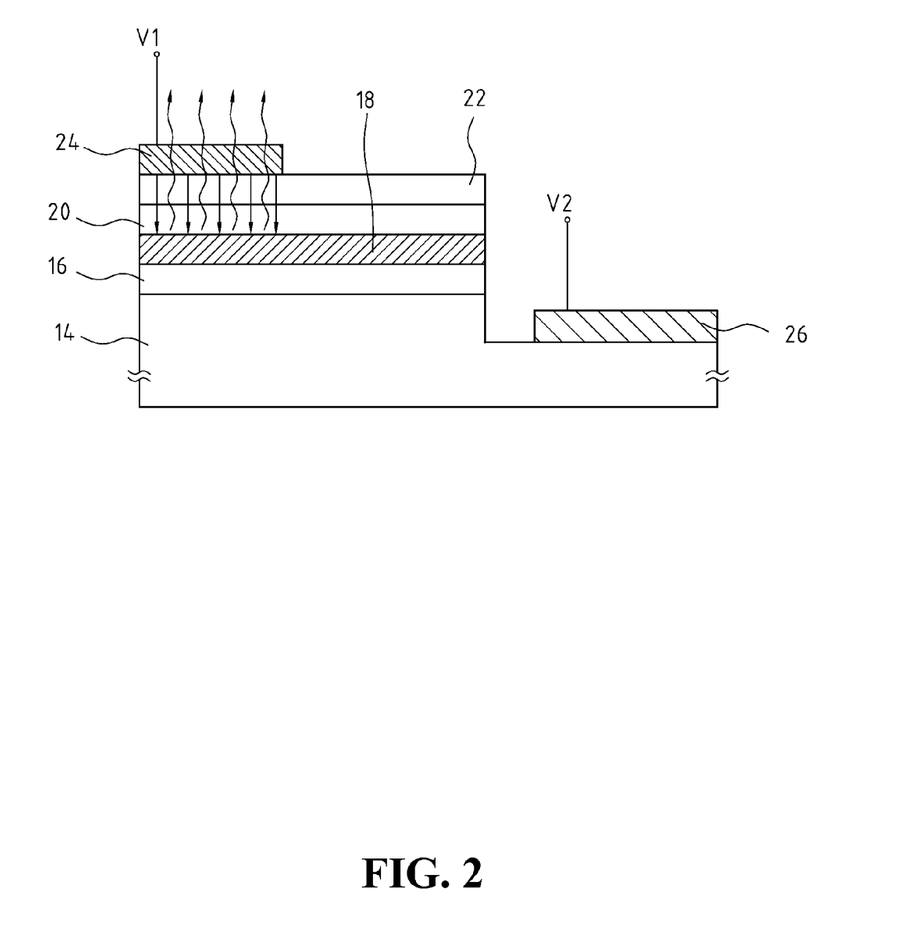
FIG. 2 is a schematic diagram showing a light emitting region of the light emitting diode 1 of FIG. 1.

FIG. 2 is a schematic diagram showing a light emitting region of the light emitting diode 1 of FIG. 1. As shown in FIG. 2, a forward bias is applied on the transparent electrode 24 and the electrode 26 of the light emitting diode 1 and causes the light emitting diode 1 to become conductive. An electric current flows from the transparent electrode 24 to the active layer 18. As the P-type Gallium nitride (GaN) contact layer 22 according to a prior art has a limited carrier density and a high contact resistance, a current spreading effect of the electric current is inferior. From FIG. 2 it is also apparent that the transparent electrode 24 covers only a section of the contact layer 22 and the electric current flows through a region only as wide as the width of the transparent electrode 24. Accordingly, the light emitting diode 1 has a restricted light emitting region and the active layer 18 is not fully exploited. A light emitting efficiency of the light emitting diode 1 is thereby significantly reduced.

In summary, a high density P-type contact layer cannot be effectively formed in a light emitting diode structure according to a prior art due to a limitation from the contact layer's physical property. This not only increases a production cost but also reduces a yield rate of the light emitting diode. Furthermore, a large part of an active layer of a light emitting diode structure according to a prior art is not fully exploited.

A light emitting diode structure according to a prior art thereby cannot provide a high light emitting efficiency. In addition, the transparent electrode and contact layer are of opposite doping types in a light emitting diode structure according to a prior art. A junction may be formed between the transparent electrode and the contact layer, and hence an operation of the light emitting diode may be affected.

Therefore, improving a contact layer's physical property can enhance a light emitting diode's light emitting efficiency. In Taiwan Patent No. 156268, a Strained Layer Supperlattice (SLS) structure is used as a light emitting diode's contact layer to enhance the light emitting diode's light emitting efficiency. Taiwan Patent Published No. 546859 also discloses a Gallium nitride (GaN) based light emitting diode with a digital penetration layer to make an ohmic contact and thereby reduce a resistance between a Indium Tin oxide layer and a P-type Gallium nitride based contact layer. It is well-known that a superlattice structure can reduce dislocations. This idea can also be applied to growth of GaN where dislocations tend to bend at the interfaces. Conventionally, the superlattice structure of AlGaN/GaN was used to reduce the cracks and dislocations in a thick GaN layer which can be formed as an upper confinement layer disposed on the light emitting layer. Despite these prior efforts do increase a light emitting efficiency to some extent, a satisfactory level is not yet to achieve.

Accordingly, the present invention is directed to obviate the problems due to limitations and disadvantages of the related arts to improve a light emitting efficiency of a light emitting diode.

SUMMARY OF THE INVENTION

An objective of the present invention is to provide a light emitting diode structure that includes a Constructive Oxide Contact Structure contact layer.

Another objective of the present invention is to provide a light emitting diode structure that can effectively reduce a resistance of a contact layer so that a light emitting efficiency can be improve.

A light emitting diode structure according to the present invention includes a contact layer of Constructive Oxide Contact Structure. The contact layer can be formed with high carrier density (i.e. high conductivity) more easily. When working with an appropriate transparent electrode, the contact layer can effectively increase a light emitting efficiency and reduce an operating voltage.

A contact layer of Constructive Oxide Contact Structure according to the present invention does not require a specific type of dopant. A transparent electrode can be formed of a material of the same conducting type as the contact layer. A junction between the transparent electrode and the contact layer can therefore be avoided.

Besides, a contact layer of Constructive Oxide Contact Structure according to the present invention has a better contact property with a transparent electrode. A transparent electrode can have a dimension roughly close to that of an active layer. A region inside the active layer through which an electric current flows can be enlarged and a light emitting region of the active layer is increased. A light emitting efficiency is thereby improved.

A light emitting diode structure according to the present invention is described as follows.

A light emitting diode structure according to the present invention is constructed on a substrate and comprises a buffer layer, a lower confinement layer, a light emitting layer, an upper confinement layer, a contact layer, a first electrode and a second electrode (transparent electrode). The buffer layer of a first conducting type is formed on the substrate. The lower confinement layer of the first conducting type is formed on the buffer layer of the first conducting type. A dopant used in the lower confinement layer is of the same type as that used in the buffer layer. That is, both are either P-type or N-type dopants. The active layer is formed on the lower confinement layer and the upper confinement layer of a second conducting type is formed on the active layer. A dopant used in the upper confinement layer is of the opposite type as that used in the lower confinement layer. For example, if one dopant used is of P-type, the other dopant used is of N-type. The contact layer is formed of a semiconducting compound material of the second conducting type on the upper confinement layer. The contact layer is a Constructive Oxide Contact Structure contact layer whose conducting type is P-type, N-type, or I-type. The transparent electrode is formed on the contact layer and is used as an anode of the light emitting diode. The second electrode is formed on the lower confinement layer spaced apart from the light emitting layer, the upper confinement layer, the contact layer, and the transparent electrode, and is used as a cathode of the light emitting diode.

The foregoing transparent electrode and the Constructive Oxide Contact Structure contact layer can be of identical or opposite conducting types. For example, both are either of P-type of N-type together, or, one is of P-type and the other one is of N-type.

Another light emitting diode structure including a Constructive Oxide Contact Structure contact layer constructed on a substrate is also disclosed in the present invention. The light emitting diode structure includes a conducting buffer layer formed on the substrate, a light emitting layer constructed on the buffer layer and interposed between an upper confinement layer and a lower confinement layer, a Constructive Oxide Contact Structure contact layer whose conducting property can be P-type, N-type, or I-type, formed on the upper confinement layer, a thin film of a conducting type formed on the Constructive Oxide Contact Structure, a second electrode (transparent electrode) formed on the thin film, and a first electrode formed on the lower confinement layer and spaced apart from the light emitting layer, the upper confinement layer, the contact layer, the thin film, and the transparent electrode. The thin film is used for current spreading and as a transparent layer. A dopant used in the upper confinement layer is of the opposite type as that used in the lower confinement layer. For example, if one dopant used is of P-type, the other dopant used is of N-type.

The foregoing transparent electrode and the Constructive Oxide Contact Structure contact layer can be of identical or opposite conducting types. For example, both are either of P-type of N-type together, or, one is of P-type and the other one is of N-type.

Further explanation to the present invention will be given through references to the following embodiments of the present invention. The embodiments of the present invention are exemplary and explanatory, and are not intended to provide further restriction to the present invention as disclosed above. To those skilled in the related arts, various modifications and variations can be made to embodiments of the present invention without departing from the spirit and scope of the present invention as claimed.

DETAILED DESCRIPTION OF THE PREFERRED EMBODIMENT

To make the objectives, characteristics, and features of the present invention more understandable to those skilled in the related arts, further explanation along with the accompanying drawings is given in the following.

In a light emitting diode structure according to the present invention, a high carrier density (i.e. high conductivity) contact layer is formed using a Constructive Oxide Contact Structure contact layer to reduce the contact layer's resistance. When working with an appropriate transparent electrode, the contact layer can effectively increase a light emitting efficiency and reduce an operating voltage.

As the Constructive Oxide Contact Structure contact layer has a higher carrier density than that of a bulk layer, an Ohmic contact can be easily formed between the contact layer and the transparent electrode above. On the other hand, for a contact layer according to a prior art with a less carrier density, a Schottky contact could be formed and an operating voltage has to be increased. In addition, the transparent electrode can be formed of a material of the same conducting type as the Constructive Oxide Contact Structure contact layer. A junction between the transparent electrode and the contact layer therefore would be difficult to form. Moreover, it would be easier to form the transparent electrode and the contact layer with consistent dimensions.

Figure 3:
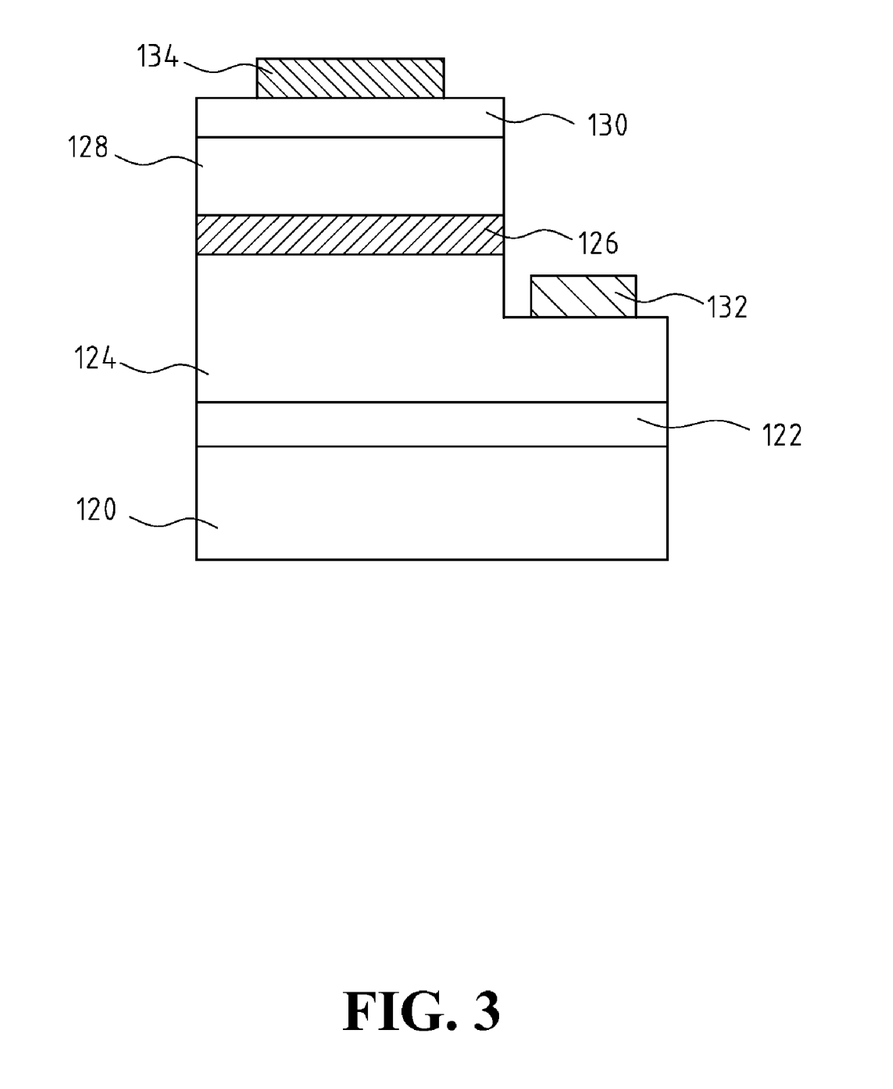
FIG. 3 is a schematic, cross-sectional diagram showing a light emitting diode structure according to the first embodiment of the present invention.

FIG. 3 is a schematic, cross-sectional diagram showing a light emitting diode structure according to the first embodiment of the present invention. As FIG. 3 shows, the light emitting diode 100 includes a substrate 120. The substrate 120 can be made of an insulating material or a semiconducting material of a conducting type. Various kinds of materials may be used without a specific limitation. Any commonly known or unknown material that can be used to form a light emitting diode's substrate can be used in the light emitting diode structure according to the present invention. Examples of the insulating material include, but not limited to, Aluminum oxide ($Al_2O_3$, sapphire), Aluminum nitride (AlN), Gallium nitride (GaN), Spinel, Lithium Gallium oxide ($LiGaO_3$), Lithium Aluminum oxide ($LiAlO_3$), etc. Examples of the conducting type semiconducting material include, but not limited to, Silicon carbide (SiC), Zinc oxide (ZnO), Silicon (Si), Gallium phosphide (GaP), Gallium arsenide (GaAs), Zinc selenium (ZnSe), Indium phosphide (InP), Si-doped conducting type Gallium nitride (GaN), etc.

Subsequently, a buffer layer 122 of a first conducting type is formed on the substrate 120. The buffer layer can be made of a compound $Al_xIn_yGa_{1-x-y}N$, wherein $x \geq 0$; $y \geq 0$; $0 \leq x+y < 1$. Examples include Indium nitride (InN), Indium Gallium nitride (InGaN), Aluminum Gallium nitride (AlGaN), and Gallium nitride (GaN).

A lower confinement layer 124 is then formed on the first conducting type buffer layer 122. The lower confinement layer can be made of a commonly known or unknown III-V group compound of Gallium nitride (GaN). This compound can be expressed by a chemical formula $Al_oIn_pGa_{1-o-p}N$, wherein $o \geq 0$; $p \geq 0$; $0 \leq o+p < 1$. An example is Gallium nitride (GaN) of a first conducting type. A light emitting layer 126 is then formed on the lower confinement layer 124. The light emitting layer can also be made of any commonly known or unknown III-V group compound semiconductors such as Indium Gallium nitride (InGaN). An upper confinement layer 128 is then subsequently formed on the light emitting layer 126. The upper confinement layer can also be made of any commonly known or unknown III-V group compound semiconductors. Examples include Gallium nitride (GaN) of a second conducting type and Aluminum Gallium nitride (AlGaN). The light emitting layer 126 is interposed between the lower confinement layer 124 and the upper confinement layer 128. The III-V group compound semiconductors used in the three layers can be adjusted based on an actual requirement and design in terms of material choice, composition, amount, and dopant used. The foregoing examples are exemplary and explanatory, and are not intended to pose restriction to the present invention as claimed.

Then a contact layer 130 is formed on the upper confinement layer 128. Within the light emitting diode 100 according to the present invention, the contact layer 130 is made of III-V group compounds with extremely high carrier densities. The contact layer is a Constructive Oxide Contact Structure contact layer built by stacking four types of materials. The four types of materials are $P^+GaN$, $Y_1InN$, $Y_2In_{x1}Ga_{1-x1}N$, and $Y_3InN$ respectively, wherein $0 \leq x1 \leq 1$. $Y_1$, $Y_2$, and $Y_3$ can be either P-type or N-type dopants. Conducting types of the materials can therefore be P-type, N-type, or I-type. The four materials can be stacked in various orders based on their use of P-type or N-type dopants. The Constructive Oxide Contact Structure contact layer has a thickness between 0.1 to 1,000 nanometers (nm).

A first electrode 132 is then formed on the lower confinement layer 124 in a region spaced apart from the light emitting layer 126, the upper confinement layer 128, and the contact layer 130. The first electrode is used as a cathode of the light emitting diode 100 and has a fine Ohmic contact with the lower confinement layer 124 resulting in a lower contact resistance. In addition, a second electrode (transparent electrode) 134 is formed on the contact layer 130. The second electrode is made of a thin metallic material and is used as an anode of the light emitting diode 100.

The foregoing first and second electrodes are metallic electrodes made of an alloy of one, two, or more metal elements selected from a group comprising Indium (In), Tin (Sn), Zinc (Zn), Nickel (Ni), Gold (Au), Chromium (Cr), Cobalt (Co), Cadmium (Cd), Aluminum (Al), Vanadium (V), Silver (Ag), Titanium (Ti), Tungsten (W), Platinum (Pt), Palladium (Pd), Rhodium (Rh), Ruthenium (Ru), etc. The thickness of the electrodes is between 1 to 10,000 nm.

Figure 4:
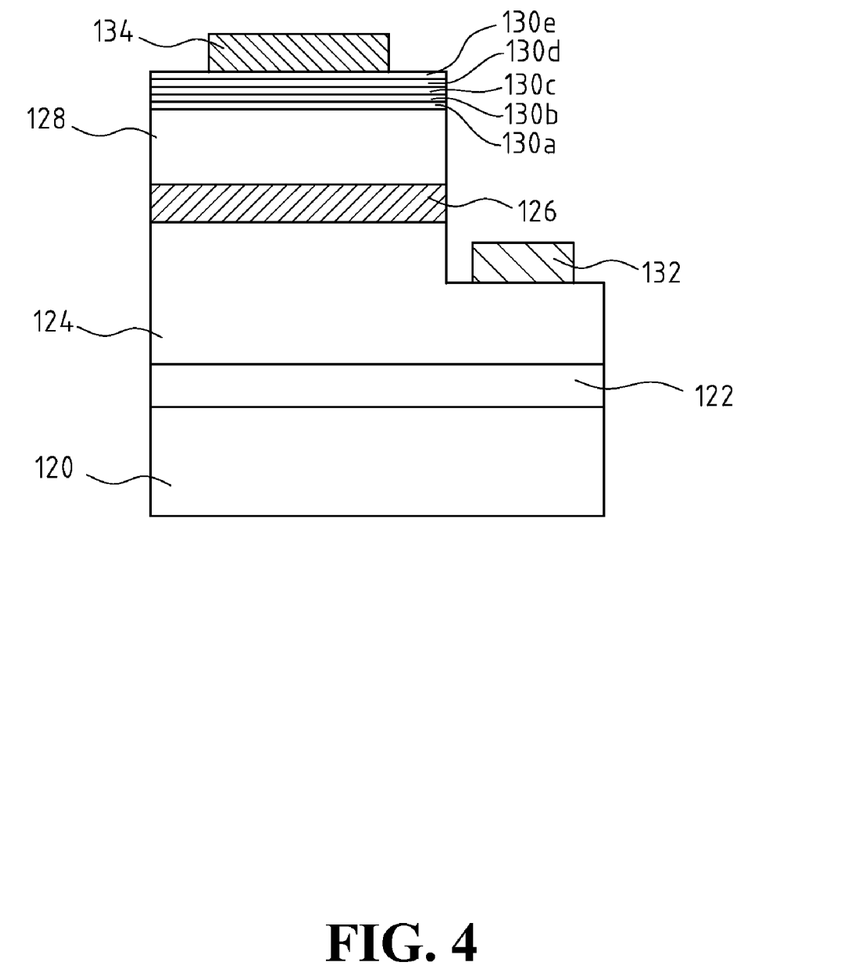
FIG. 4 is a schematic, cross-sectional diagram showing a light emitting diode structure according to the second embodiment of the present invention.

FIG. 4 is a schematic, cross-sectional diagram showing a light emitting diode structure according to the second embodiment of the present invention. The same reference numerals denote the same elements as in FIG. 3. According to the second embodiment of the present invention, the upper confinement layer 128 is made of p-GaN, and the Constructive Oxide Contact Structure contact layer consists of an InN layer 130a, an $In_xGa_{1-x}N$ layer 130b, an $In_yGa_{1-y}N$ layer 130c, an $In_zGa_{1-z}N$ layer 130d, and an InN layer 130e, sequentially stacked from bottom to top in this order as shown in FIG. 4, wherein $0 \leq x < 1$, $0 \leq y < 1$, and $0 \leq z < 1$, and $y > z > x$. Moreover, the thicknesses of these layers are decreased in the order of p-GaN layer 128 > InN layer 130a > $In_yGa_{1-y}N$ layer 130c > InN layer 130e. Furthermore, the thickness of the InN layer 130a preferably has a thickness of not more than 10 nm, the thickness of the $In_yGa_{1-y}N$ layer 130c preferably has a thickness of not more than 5 nm, and the thickness of the InN layer 130e preferably has a thickness of not more than 2 nm. Moreover, the InN layer 130e which has a low band gap is functioned as an ohmic contact layer for directly contacting with the second electrode 134, and thereby the thickness of the InN layer 130e is preferably thin enough to decrease contact resistance between the InN layer 130e and the second electrode 134. On the other hand, the thickness of $In_zGa_{1-z}N$ layer 130d is preferably thin enough for the hole carriers to tunnel through.

Figure 5:
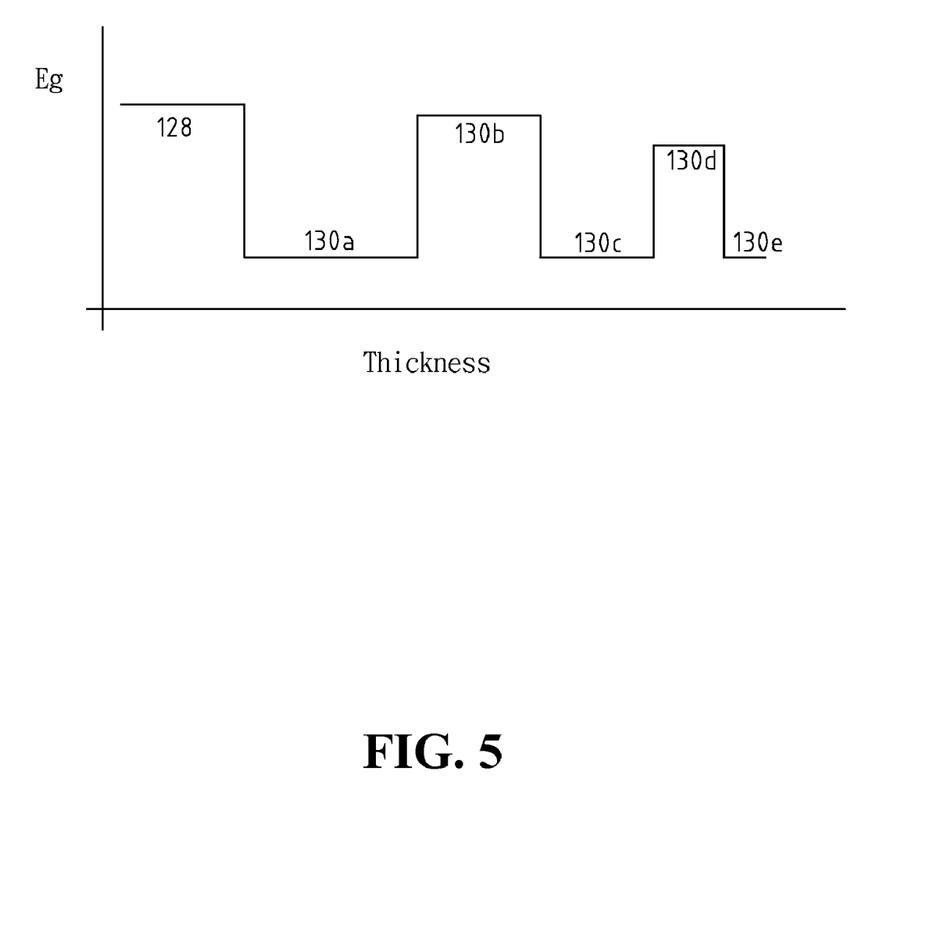
FIG. 5 is the schematic diagram of the band gap versus the thickness for the p-GaN layer, the InN layer, the $In_xGa_{1-x}N$ layer, the $In_yGa_{1-y}N$ layer, the $In_xGa_{1-z}N$ layer, and the InN layer, sequentially stacked from bottom to top on the light emitting layer.

Furthermore, FIG. 5 is the schematic diagram of the band gap versus the thickness for the p-GaN layer, the InN layer, the $In_xGa_{1-x}N$ layer, the $In_yGa_{1-y}N$ layer, the $In_zGa_{1-z}N$ layer, and the InN layer, sequentially stacked from bottom to top on the light emitting layer. As shown in FIG. 5, the band gaps, Eg, are decreased in the order of p-GaN layer 128 > $In_xGa_{1-x}N$ layer 130b > $In_zGa_{1-z}N$ layer 130d > $In_yGa_{1-y}N$ layer 130c. The band gaps of p-GaN layer 128, the InN layer 130a, the $In_xGa_{1-x}N$ layer 130b, the $In_yGa_{1-y}N$ layer 130c, the $In_zGa_{1-z}N$ layer 130d, and the InN layer 130e, sequentially stacked from bottom to top on the light emitting layer, are found to be in a gradient ramp up, plateau and ramp down profile. If the band gaps of the layers stacked from bottom to top are designed in such a gradient ramp up, plateau and ramp down profile, the hole carriers can be much more easily injected from the electrode to the light emitting layer because the contact resistance can be reduced in this case. On the other hand, it is worthy to note that when the hole carriers reach to the InN layer 130a, the hole carriers can be effectively injected into the p-GaN layer 128. That is because the thickness of the InN layer 130a is relatively large, and the magnitude of the band gap of the p-GaN layer 128 is relatively large so that the hole carriers have more chance to laterally spread. Likewise, when the hole carriers reach to the $In_yGa_{1-y}N$ layer 130c, the hole carriers can be also effectively pass through the $In_xGa_{1-x}N$ layer 130b. Consequently, according to the second embodiment of the present invention, the free carriers (electrons or holes) can be effectively injected, and the light emitting diode will not have a restricted light emitting region, and the light emitting layer can be fully exploited. The light emitting efficiency of the light emitting diode is thereby significantly increased.

Figure 6:
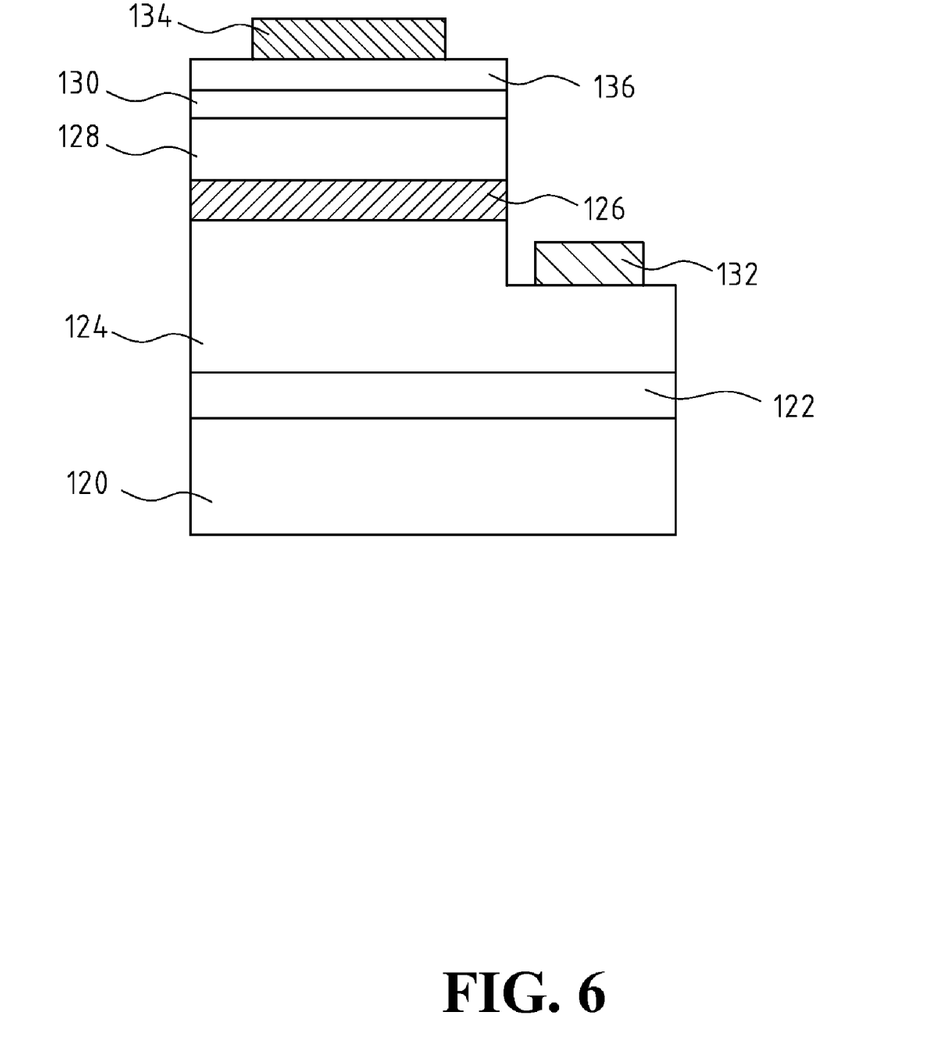
FIG. 6 is a schematic, cross-sectional diagram showing a light emitting diode structure according to the third embodiment of the present invention.

FIG. 6 is a schematic, cross-sectional diagram showing a light emitting diode structure according to the third embodiment of the present invention. The embodiment has a similar structure as shown in FIG. 3 or 4 except that a thin film 136 of a conducting type is formed on the contact layer 130. The thin film is used for current spreading and light transparency. The thin film can also be applied in a flip chip packaging of a light emitting diode so that a heat dissipation property and an anti-electrostatic capability of the light emitting diode can be enhanced. The thin film 136 is a transparent oxide conducting layer made of an oxide thin film or an alloy, both of one, two, or more metal elements selected from a group comprising Indium (In), Tin (Sn), Zinc (Zn), Nickel (Ni), Gold (Au), Chromium (Cr), Cobalt (Co), Cadmium (Cd), Aluminum (Al), Vanadium (V), Silver (Ag), Titanium (Ti), Tungsten (W), Platinum (Pt), Palladium (Pd), Rhodium (Rh), Ruthenium (Ru), etc. The thickness of the thin film is between 1 to 1,000 nm. The thin film 136 can also be made of an alloy of one, two, or more metal elements with a high reflectivity such as, but not limited to, Aluminum (Al), Silver (Ag), Platinum (Pt), Palladium (Pd), Rhodium (Rh), Ruthenium (Ru), Titanium (Ti), Gold (Au), Nickel (Ni), and Copper (Cu), etc.

As the Constructive Oxide Contact Structure contact layer has a higher carrier density than that of a bulk layer, an Ohmic contact can be easily formed between the contact layer and the transparent electrode above. On the other hand, for a contact layer according to a prior art whose carrier density is not high enough, a Schottky contact could be formed and an operating voltage has to be increased. In addition, the transparent electrode can be formed of a material of the same conducting type as the Constructive Oxide Contact Structure contact layer. A junction between the transparent electrode and the contact layer cannot be formed easily. Moreover, it would be easier to form the transparent electrode and the contact layer with consistent dimensions.

In summary, a light emitting diode structure according to the present invention at least has the following features: (1) A contact layer with a high carrier density can be easily formed for a light emitting diode, using a Constructive Oxide Contact Structure contact layer as disclosed by the present invention. (2) A light emitting efficiency can be increased and an operating voltage can be reduced, as an Ohmic contact with a better contact property exists between a transparent electrode and a Constructive Oxide Contact Structure contact layer as disclosed by the present invention. (3) Conducting types of a transparent electrode and a Constructive Oxide Contact Structure contact layer as disclosed by the present invention can be identical or opposite. When conducting types are identical, a junction therebetween can be further avoided.

In general, light emitting diodes are susceptible to static electricity. However, for a light emitting diode with a Constructive Oxide Contact Structure contact layer according to the present invention, an anti-electrostatic discharge capability can be effectively increased, as illustrated in Table 1 when light emitting diode structures according to a prior art and the present invention respectively are put under electrostatic tests.

Figure 7:
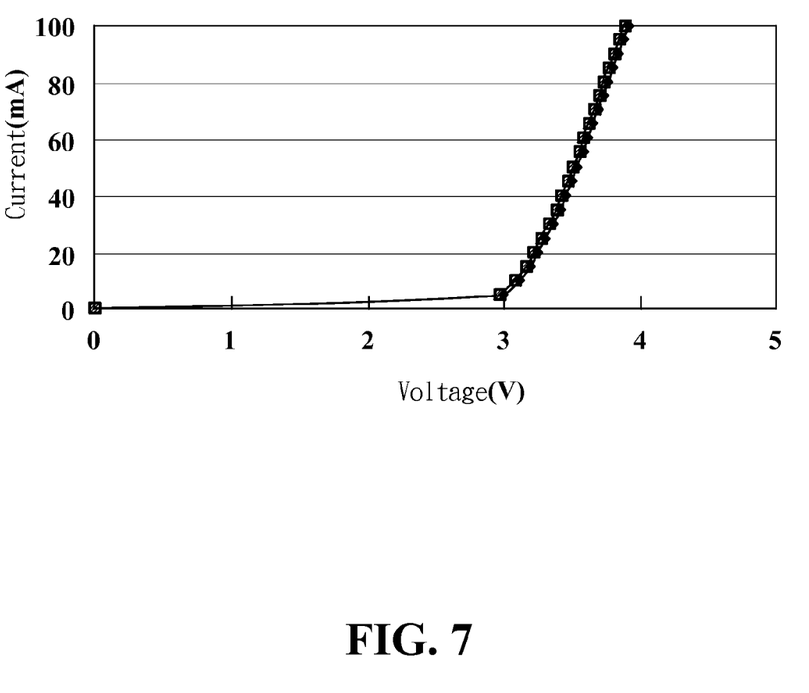
FIG. 7 is a current-voltage characteristics graph showing data obtained from testing light emitting diodes according to a prior art (shown with the legend ♦) and the first embodiment of the present invention (shown with the legend ■) respectively.

FIG. 7 is a current-voltage characteristics graph showing data obtained from testing light emitting diodes according to a prior art and the first embodiment of the present invention respectively. As shown in FIG. 7, at a same current level within a low current rage, a light emitting diode according to the first embodiment of the present invention requires a lower voltage level than a light emitting diode according to the prior art.

Figure 8:
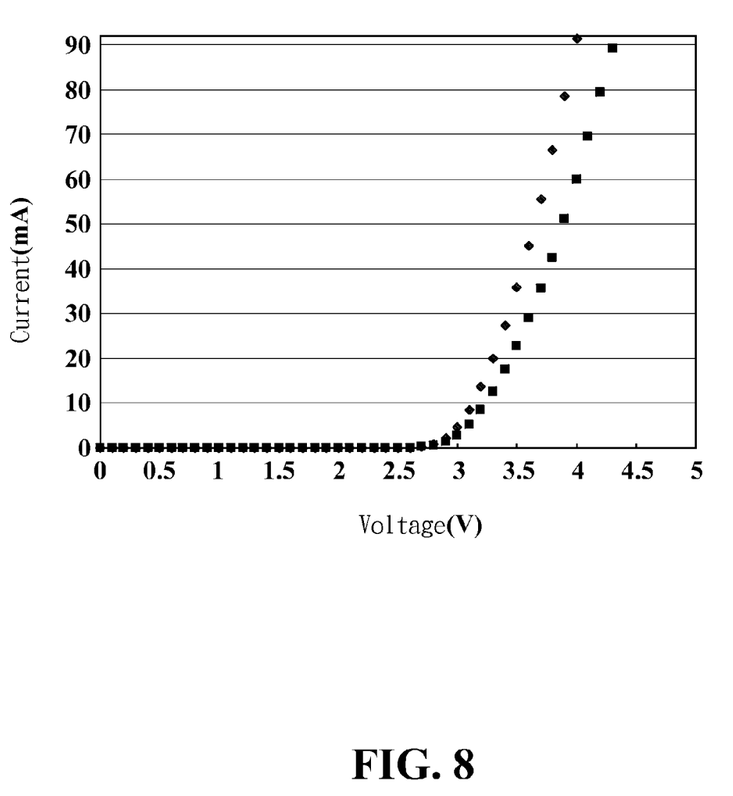
FIG. 8 is a current-voltage characteristics graph showing data obtained from testing light emitting diodes according to the prior art of eight pairs of AlGaN/GaN supperlatice contact layer (shown with the legend ■) and the second embodiment of the present invention (shown with the legend ♦) respectively.

FIG. 8 is a current-voltage characteristics graph showing data obtained from testing light emitting diodes according to the prior art of eight pairs of AlGaN/GaN supperlatice (shown with the legend ■) and the second embodiment of the present invention (shown with the legend ♦) respectively. As shown in FIG. 7, at a same current level within a low current rage, a light emitting diode according to the third embodiment of the present invention requires a lower voltage level than a light emitting diode according to the prior art.

Figure 9:
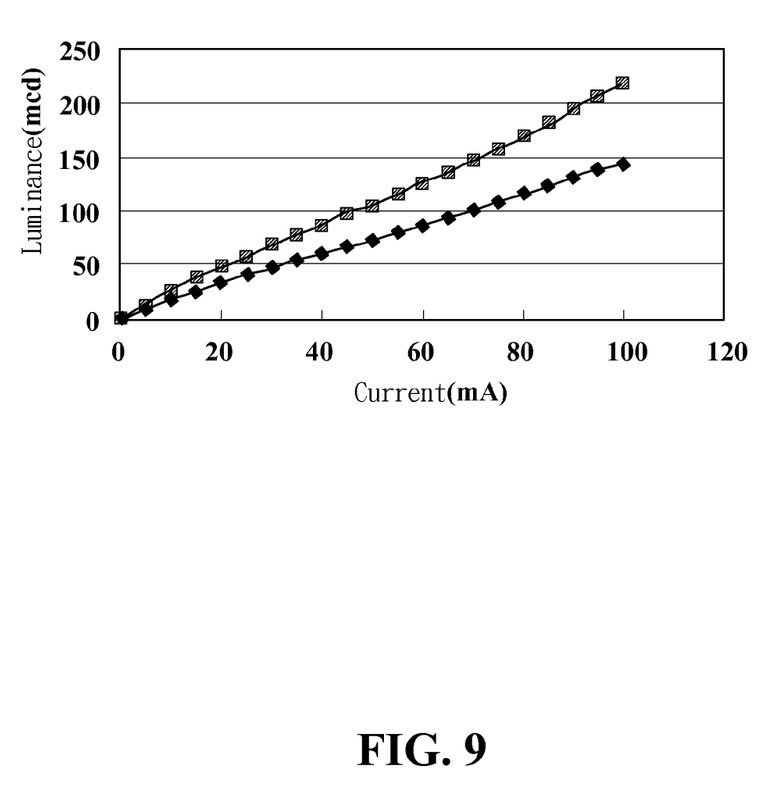
FIG. 9 is a luminance-current characteristics graph showing data obtained from testing light emitting diodes according to a prior art (shown with the legend ♦) and the first embodiment of the present invention (shown with the legend ■) respectively.

FIG. 9 is a luminance-current characteristics graph showing data obtained from testing light emitting diodes according to a prior art and the first embodiment of the present invention respectively. As shown in FIG. 9, at a same current level, a light emitting diode according to the present invention has a better luminance than a light emitting diode according to the prior art.

Based on the foregoing description, a light emitting diode structure according to the present invention indeed has a higher light emitting efficiency, a lower operating voltage, and a stronger anti-electrostatic discharge capability than a light emitting diode structure according to the prior art.

TABLE 1 result of electrostatic tests of a light emitting diode structure according to the present invention

| Human Body Mode(HBM) | | Machine Mode (MM) | | | | Testing Standard | | | | |
|---|---|---|---|---|---|---|---|---|---|---|
| Level 1 | 0~4999(v) | M0 | 0~49(v) | M3 | 200~399(v) | | | | | |
| Level 2 | 2000~3999(v) | M1 | 50~99(v) | M4 | 400~799(v) | HBM MIL-STD-883C Method 3015.7 | | | | |
| Level 3 | 4000~5999(v) | M2 | 100~199(v) | M5 | >799(v) | MM EIAJ-IC-121 Method 20 | | | | |

| Item | Crystalline grain type | Electrostatic testing mode | 1 | 2 | 3 | 4 | 5 | 6 | 7 | 8 | 9 | 10 |
|---|---|---|---|---|---|---|---|---|---|---|---|---|
| 1 | Light emitting diode structure according to a prior art | HBM (+) | 2000 | 2500 | 2000 | 2500 | 3000 | 2500 | 2500 | 3000 | 2500 | 3000 |
| | | HBM (−) | −250 | −1500 | −2000 | −1750 | −200 | −1000 | −250 | −500 | −2000 | −500 |
| | | MM (+) | 250 | 100 | 300 | 200 | 100 | 250 | 150 | 100 | 300 | 200 |
| | | MM (−) | −75 | −25 | −100 | −50 | −75 | −25 | −100 | −75 | −50 | −50 |
| 2 | Light emitting diode structure according to the present invention | HBM (+) | 4000 | 5000 | 4000 | 5000 | 7000 | 6000 | 4500 | 5000 | 4500 | 5000 |
| | | HBM (−) | −5000 | −3000 | −4000 | −3000 | −5000 | −3000 | −4000 | −4500 | −5000 | −4000 |
| | | MM (+) | 700 | 500 | 500 | 1000 | 500 | 700 | 800 | 600 | 750 | 500 |
| | | MM (−) | −800 | −600 | −450 | −500 | −600 | −700 | −500 | −600 | −600 | −500 |

What is claimed is:

1. A light emitting diode structure, comprising:
a substrate;
a first semiconductor layer formed directly on the substrate;
a light emitting layer formed directly on the first semiconductor layer;
a second semiconductor layer formed directly on the light emitting layer;
a contact layer formed directly on the second semiconductor layer, wherein the contact layer comprises a first InN layer, an $In_xGa_{1-x}N$ layer, an $In_yGa_{1-y}N$ layer, an $In_zGa_{1-z}N$ layer, and a second InN layer, sequentially stacked in this order from bottom to top on the second semiconductor layer, wherein the band gaps of the layers are decreased in the order of the second semiconductor layer>the $In_xGa_{1-x}N$ layer>the $In_zGa_{1-z}N$ layer>the $In_yGa_{1-y}N$ layer.

2. The structure according to claim 1, wherein the second semiconductor layer is made of Gallium nitride (GaN).

3. The structure according to claim 2, wherein the thicknesses of the layers are decreased in the order of the GaN layer>the first InN layer>the $In_yGa_{1-y}N$ layer>the second InN layer.

4. The structure according to claim 1, wherein the thickness of the first InN layer is not more than 10 nm, the thickness of the $In_yGa_{1-y}N$ layer is not more than 5 nm, and the thickness of the second InN layer is not more than 2 nm.

5. The structure according to claim 1, wherein the contact layer has a thickness between 0.1 to 1,000 nm.

6. The structure according to claim 1, wherein the substrate is made of an insulating material or a semiconducting material of a conducting type.

7. The structure according to claim 6, wherein the insulating material is selected from a group comprising Aluminum oxide ($Al_2O_3$, sapphire), Aluminum nitride (AlN), Gallium nitride (GaN), Spinel, Lithium Gallium oxide ($LiGaO_3$), Lithium Aluminum oxide ($LiAlO_3$).

8. The structure according to claim 6, wherein the semiconducting material is selected from a group comprising Silicon carbide (SiC), Zinc oxide (ZnO), Silicon (Si), Gallium phosphide (GaP), Gallium arsenide (GaAs), Zinc selenium (ZnSe), Indium phosphide (InP), Gallium nitride (GaN) of a Si-doped conducting type.

9. The structure according to claim 1, further comprising a thin film of a conducting type directly formed on the contact layer.

* * * * *